(12) United States Patent
Nagano et al.

(10) Patent No.: US 10,609,802 B2
(45) Date of Patent: Mar. 31, 2020

(54) HIGH-TEMPERATURE PLASMA RAW MATERIAL SUPPLY APPARATUS AND EXTREME ULTRA VIOLET LIGHT SOURCE APPARATUS

(71) Applicant: USHIO DENKI KABUSHIKI KAISHA, Tokyo (JP)

(72) Inventors: Akihisa Nagano, Tokyo (JP); Daiki Yamatani, Tokyo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/304,066

(22) PCT Filed: May 11, 2017

(86) PCT No.: PCT/JP2017/017831
§ 371 (c)(1),
(2) Date: Nov. 21, 2018

(87) PCT Pub. No.: WO2017/203988
PCT Pub. Date: Nov. 30, 2017

(65) Prior Publication Data
US 2019/0339620 A1 Nov. 7, 2019

(30) Foreign Application Priority Data
May 27, 2016 (JP) ................................ 2016-106710

(51) Int. Cl.
*H05G 2/00* (2006.01)
*G03F 7/20* (2006.01)
*H05H 1/24* (2006.01)
(52) U.S. Cl.
CPC .......... *H05G 2/00* (2013.01); *G03F 7/70033* (2013.01); *H05G 2/006* (2013.01); *H05H 1/24* (2013.01);
(Continued)

(58) Field of Classification Search
None
See application file for complete search history.

(56) References Cited

U.S. PATENT DOCUMENTS 9,018,604 B2    4/2015 Niimi et al.
9,480,136 B2 *  10/2016 Teramoto ............... H05G 2/005
(Continued)

FOREIGN PATENT DOCUMENTS

JP    2013191577 A  *  9/2013  ............... H05G 2/00
JP    2014-225437 A    12/2014

OTHER PUBLICATIONS

International Search Report issued in PCT/JP2017/017831; dated Aug. 8, 2017.

*Primary Examiner* — Michael J Logie
(74) *Attorney, Agent, or Firm* — Studebaker & Brackett PC

(57) ABSTRACT

Disclosed herein a high temperature plasma raw material supply apparatus capable of appropriately supplying high temperature plasma raw materials in which impurities are suppressed to a reservoir reserving high temperature plasma raw material in a liquid state. A tin filling mechanism includes a raw material reservoir unit rotatably arranged and configured to reserve a plurality of high temperature plasma raw materials in a solid state; a supply nozzle configured to supply the high temperature plasma raw materials to an outside of the raw material reservoir unit; a load lock unit provided between a housing and a chamber; and a supply path unit configured to guide the high temperature plasma raw materials supplied from the supply nozzle to the load lock unit. At least a part of the supply path unit is provided with a hole formed smaller than the high temperature plasma raw material in the solid state.

10 Claims, 6 Drawing Sheets

(52) U.S. Cl.
CPC .............. *H05G 2/001* (2013.01); *H05G 2/003* (2013.01); *H05G 2/005* (2013.01)

(56) References Cited

U.S. PATENT DOCUMENTS

| | | | |
|---|---|---|---|
| 2006/0192155 A1* | 8/2006 | Algots | H05G 2/003 250/504 R |
| 2008/0067456 A1* | 3/2008 | Kloepfel | H05G 2/003 250/504 R |
| 2010/0143202 A1* | 6/2010 | Yabu | H05G 2/003 422/111 |
| 2014/0205369 A1* | 7/2014 | Dietrich | F16D 1/027 403/271 |
| 2014/0253716 A1* | 9/2014 | Saito | H05G 2/006 348/87 |
| 2014/0261761 A1* | 9/2014 | Vaschenko | H05G 2/005 137/334 |
| 2015/0209701 A1* | 7/2015 | Fomenkov | B22F 3/105 250/432 R |
| 2015/0282285 A1* | 10/2015 | Shirai | H05G 2/005 315/246 |
| 2016/0073486 A1* | 3/2016 | Teramoto | H05G 2/005 250/504 R |
| 2017/0280543 A1* | 9/2017 | Hori | H05G 2/005 |
| 2017/0350745 A1* | 12/2017 | Nagano | G01F 23/24 |

\* cited by examiner

HIGH-TEMPERATURE PLASMA RAW MATERIAL SUPPLY APPARATUS AND EXTREME ULTRA VIOLET LIGHT SOURCE APPARATUS

FIELD OF THE INVENTION

The present invention relates to a high temperature plasma raw material supply apparatus that supplies high temperature plasma raw materials, and also relates to an extreme ultra violet light source apparatus provided with the high temperature plasma raw material supply apparatus.

DESCRIPTION OF THE RELATED ART

Recent years, as a semiconductor integrated circuit is being miniaturized and highly integrated, the wavelength of a light source for the exposure becomes shorter and shorter. As a next generation of a light source for exposing the semiconductor, an extreme ultra violet light source apparatus for emitting Extreme Ultra Violet light (hereinafter also referred to as "EUV" light) having in particular the wavelength of 13.5 nm (hereinafter also referred to as "EUV light source apparatus") has been under development.

Several methods for generating the EUV light have been known in relation to the EUV light source apparatus. Amongst them, one method is known that heats and excites the extreme ultra violet light radiation species (hereinafter referred to as "EUV radiation species") to generate the high temperature plasma, and extracts the EUV light from the generated high temperature plasma.

The EUV light source apparatus employing the above kind of method includes a Discharge Produced Plasma (hereinafter referred to as "DPP") type EUV light source apparatus.

The DPP type EUV light source apparatus applies the high voltage between electrodes to which discharge gas containing an extreme ultra violet light radiation source, and generates a high density high temperature plasma by the discharge so as to extract and use the extreme ultra violet light radiated therefrom. In connection with the DPP type EUV light source apparatus, a certain method has been proposed in which a high temperature plasma raw material (for example, Sn (tin)) in a liquid state is supplied to surfaces of the electrodes at which the discharge is to be generated, the raw material is evaporated by irradiating the raw material with an energy beam such as a laser beam or the like, and then the high temperature plasma is generated by the discharge. Such method is also referred to as a Laser Assisted Discharge Plasma (LDP) type method.

The EUV light source apparatus of the LDP type is provided with a pair of electrodes of a disk-like (disc-like) shape separated from each other at a predetermined interval. The electrodes are rotatably arranged, respectively. Apart of the electrode is immersed in the high temperature plasma raw material in a liquid state contained in the container. By rotating the electrodes, the high temperature plasma raw material is transported into a discharge region in the EUV light source apparatus of the LDP type.

Also, in this kind of EUV light source apparatus of the LDP type, a reservoir, which has a relatively large capacity, is separately provided from the container. The reservoir reserves the high temperature plasma raw material, and an amount of the high temperature plasma raw material in the container is kept constant by supplying the high temperature plasma raw material from the reservoir to the container.

Patent Literature 1 (Laid-open Publication of Japanese Patent Application No. 2014-225437 A1) discloses a mechanism that cyclically supplies the container with the high temperature plasma raw material in a liquid state (that is, liquid tin) reserved in the reservoir.

LISTING OF REFERENCES

Patent Literatures

Patent Literature 1: Laid-open Publication of Japanese Patent Application No. 2014-225437 A1

SUMMARY OF THE INVENTION

Problems to be Solved by the Invention

In the meantime, in the above mentioned EVU light source apparatus, the high temperature plasma raw material is being consumed while the EUV radiation is generated. Thus, the storage amount of the high temperature plasma raw material reserved in the reservoir gradually decreases. For this reason, in order to operate the EUV light source apparatus in a stable manner for a long time, it is required to refill (or replenish) the reservoir with the high temperature plasma raw material on a regular basis.

Also, in order not to unintentionally change the temperature of the liquid tin reserved in the reservoir, it may be considered to supply the liquid tin to the reservoir. However, when the liquid tin is instead supplied to the reservoir, in order to prevent the liquid tin from solidifying, it is required to provide a heating mechanism provided for maintain the temperature of a whole supply path to be equal to or greater than the melting point of tin. In addition, in order to prevent the supply path from being eroded by the liquid tin inside the supply path, it is required to apply the chemical resistance against the liquid tin to an inner face of the supply path. In this way, an overall configuration of the whole apparatus becomes inevitably complicated.

On the other hand, when a solid tin is supplied to the reservoir, it is not required to provide the above mentioned heating mechanism or to apply the chemical resistance to the inner face of the supply path. However, as a surface of the solid tin is coated with tin oxide, it may entail a drawback that impurities such as tin oxide are likely to be unintentionally mixed into the reservoir when supplying the solid tin.

The present invention has been made in view of the above mentioned circumstances and an object thereof is to provide a high temperature plasma raw material supply apparatus that is capable of appropriately supplying high temperature plasma raw material in which impurities are reduced or suppressed to a reservoir reserving the high temperature plasma raw material in a liquid state with a relatively simplified structure. An another object of the present invention is to provide an extreme ultra violet light source apparatus that is provided with the high temperature plasma raw material supply apparatus.

Solution to the Problem

According to one aspect of the present invention, there is provided a high temperature plasma raw material supply apparatus for supplying high temperature plasma raw material to a container containing the high temperature plasma raw material in a liquid state for generating a high temperature plasma, comprising: a raw material reservoir unit rotatably arranged and configured to reserve a plurality of high temperature plasma raw materials in a solid state; a supply nozzle penetrating into the raw material reservoir unit and configured to supply the high temperature plasma raw materials reserved in the raw material reservoir unit to an outside of the raw material reservoir unit; a load lock unit provided between a space to which the high temperature plasma raw materials are supplied from the supply nozzle and a space in which the container is arranged; and a supply path unit configured to guide the high temperature plasma raw materials supplied from the supply nozzle to the load lock unit, at least apart of the supply path unit being provided with a hole formed to be smaller than the high temperature plasma raw material in the solid state.

With the high temperature plasma raw material supply apparatus being so configured, as the high temperature plasma raw material supply apparatus handles high temperature plasma raw materials in a solid state, it is not required to provide a heating mechanism that keeps the high temperature plasma raw materials to be in a liquid state.

In addition, it is not required to apply the chemical resistance within the high temperature plasma raw material supply apparatus against the high temperature plasma raw material in a liquid state.

Furthermore, by rotating the raw material reservoir unit, it makes it possible to move the high temperature plasma raw materials in a solid state reserved in the raw material reservoir unit so as to supply the high temperature plasma raw materials in the solid state to an outside of the raw material reservoir unit through the supply nozzle. As a result, it makes it possible to supply the high temperature plasma raw materials in a solid state with a relatively simplified structure.

Yet furthermore, it makes it possible to allow the impurities such as oxide or the like, which exfoliate from surfaces of the high temperature plasma raw materials, to fall off from a hole formed at the supply path on the way guiding the high temperature plasma raw materials in a solid state to the load lock unit. For this reason, it makes it possible to prevent the impurities from being mixed into the container.

Furthermore, the above described high temperature plasma raw material supply apparatus may further comprise a controller configured to control at least one of supply number (or quantity) and supply interval of the high temperature plasma raw materials supplied from the supply nozzle.

With this configuration, it makes it possible to prevent a large amount of the high temperature plasma raw materials in a solid state from being excessively supplied at one time so as to prevent the high temperature plasma raw materials in a solid state from clogging. In addition, it makes it possible to prevent the temperature of the high temperature plasma raw material in a liquid state in the container from being lowered due to the excessive supply of a large amount of the high temperature plasma raw materials in the solid state at one time.

Furthermore, in the above described high temperature plasma raw material supply apparatus, the supply nozzle may be shaped in an L-shape or substantially in the L-shape in which a tip opening of the supply nozzle inside the raw material reservoir unit is directed in a horizontal or substantially in the horizontal direction and a tip opening of the supply nozzle outside the raw material reservoir unit is directed downwardly in a vertical direction.

With this configuration, it makes it possible to ensure to prevent a large amount of the high temperature plasma raw materials in a solid state from being accidentally supplied at one time from the supply nozzle.

Yet furthermore, the above described high temperature plasma raw material supply apparatus may further comprise a raw material counter unit configured to count the high temperature plasma raw materials supplied from the supply nozzle.

With this configuration, it makes it possible to appropriately control a supply amount (or volume) of the high temperature plasma raw materials in a solid state. In addition, it makes it possible to detect any defect that, for example, the supply nozzle fails to supply the high temperature plasma raw materials in the solid state.

Yet furthermore, in the above described high temperature plasma raw material supply apparatus, the supply path unit may be shaped in a net-like (or mesh-like) shape. With this configuration, impurities are more likely to fall off from the supply path unit so that it makes it possible to appropriately prevent the impurities from being mixed into the container.

Yet furthermore, in the above described high temperature plasma raw material supply apparatus, the supply path unit may be configured to be capable of changing a guiding direction of the high temperature plasma raw materials.

With this configuration, when a plurality of containers are provided and a plurality of load lock units are also arranged corresponding to respective containers, it makes it possible to change (or switch) the guiding direction of the high temperature plasma raw materials so as to appropriately supply the high temperature plasma raw materials. In other words, it makes it possible to share the supply path unit among a plurality of containers.

Yet furthermore, in the above described high temperature plasma raw material supply apparatus, the supply path unit may be configured to be capable of oscillating (rocking or swinging) around (about) an axis in a horizontal direction. In other words, the supply path unit may have a seesaw structure. With this configuration, it makes it possible to change (or switch) the guiding direction of the high temperature plasma raw materials by controlling the slope (or inclination) of the supply path unit. Thus, it makes it possible to change (or switch) the supply destination of the high temperature plasma raw materials with a simplified structure.

Yet furthermore, in the above described high temperature plasma raw material supply apparatus, the supply path unit may be made of a material that is harder than the high temperature plasma raw material in the solid state. With this configuration, it makes it possible to suppress the high temperature plasma raw materials from bouncing back when the supply path unit receives the high temperature plasma raw materials falling off (or dropping) from the supply nozzle. As a result, it makes it possible to appropriately guide the high temperature plasma raw materials to the load lock unit.

Yet furthermore, in the above described high temperature plasma raw material supply apparatus, the high temperature plasma raw material in the solid state may have a spherical shape. With this configuration, the high temperature plasma raw materials in the solid state are capable of having a shape that easily rolls on the supply path unit and prevents the high temperature plasma raw materials from clogging.

According to one aspect of the present invention, there is provided an extreme ultra violet light source apparatus for radiating extreme ultra violet light, comprising: the above described high temperature plasma raw material supply apparatus; the container; a chamber constituting a space in which the container is arranged; a raw material supply mechanism configured to supply a high temperature plasma raw material in a liquid state contained in the container to a high temperature plasma generating unit configured to generate the high temperature plasma; and the high temperature plasma generating unit configured to heat and excite the high temperature plasma raw material in the liquid state supplied from the raw material supply mechanism to generate high temperature plasma.

With this configuration, it makes it possible to radiate the extreme ultra violet light (EUV light) in a stable manner.

Yet furthermore, the extreme ultra violet light source apparatus may further comprise a connection path unit arranged in the chamber and configured to connect the load lock unit to the container, and at least a part of the connection path unit may include a curvature (bend or flexion) portion. With this configuration, it makes it possible to allow the high temperature plasma raw materials passing through the connection path unit to have the distribution of velocity so as to appropriately prevent the high temperature plasma raw materials from clogging.

Advantageous Effect of the Invention

According to the high temperature plasma raw material supply apparatus of the present invention, it makes it possible to appropriately supply the high temperature plasma raw material to a container containing the high temperature plasma raw material in a liquid state such as molten tin or the like with a simplified structure. In addition, it makes it possible to prevent impurities such as oxide or the like of the high temperature plasma raw materials from being mixed into the container. As a result, the extreme ultra violet light source apparatus provided with the high temperature plasma raw material supply apparatus is capable of radiate the extreme ultra violet light (EUV light) in a stable manner.

The above mentioned and other not explicitly mentioned objects, aspects and advantages of the present invention will become apparent to a skilled person from the following detailed description when read and understood in conjunction with the appended claims and drawings.

DETAILED DESCRIPTION OF THE INVENTION

Hereinafter, referring to the accompanying drawings, an exemplary embodiment of the present invention will be described in detail.

Figure 1:
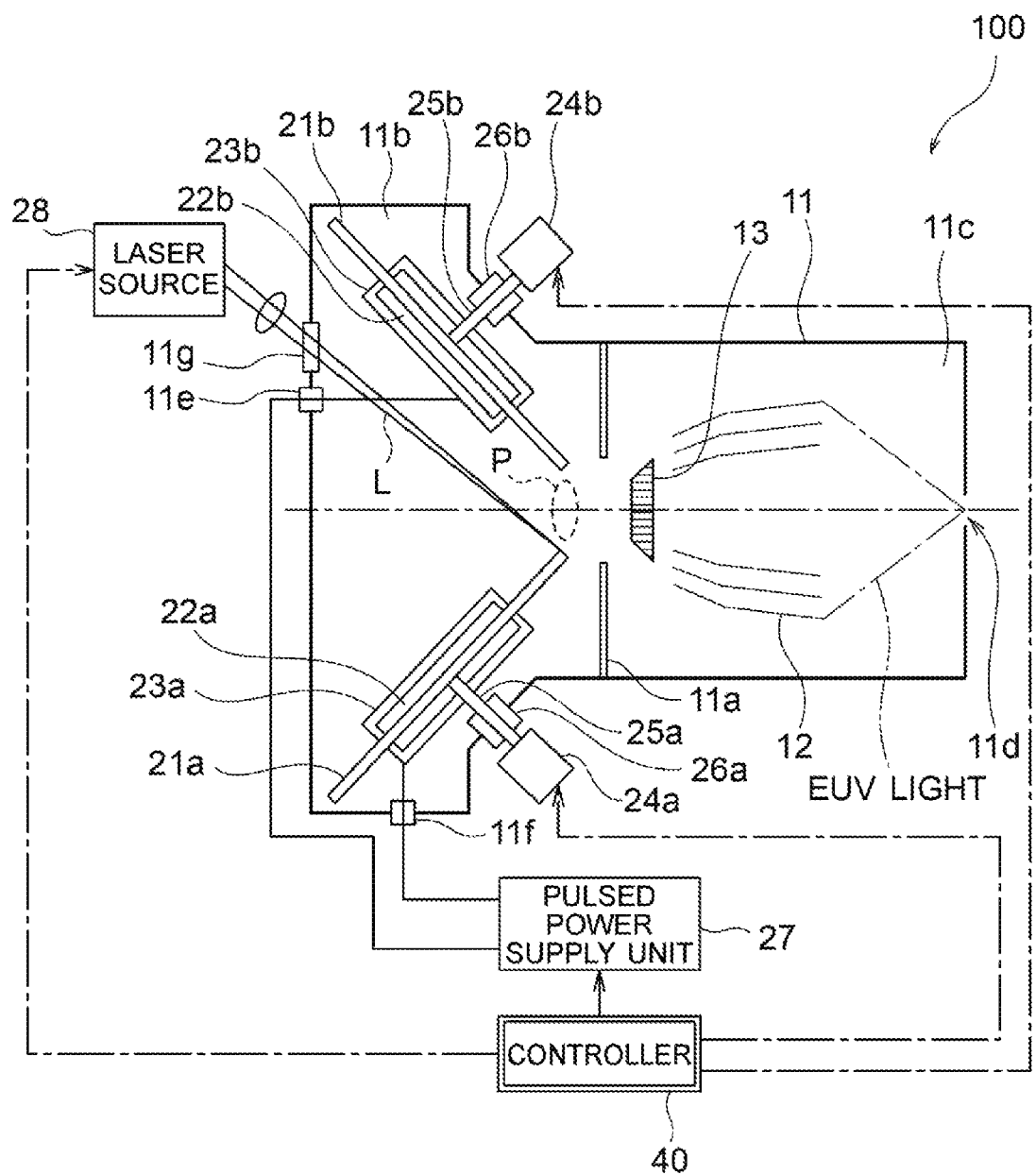
FIG. 1 is a view schematically showing an exemplary configuration of an extreme ultra violet light source apparatus according to the present embodiment.

FIG. 1 is a view schematically showing an exemplary configuration of an Extreme Ultra Violet light source apparatus (EUV light source apparatus) 100 according to an exemplary embodiment of the present invention.

The EUV light source apparatus 100 is an apparatus that emits extreme ultra violet light (EUV light) having a wavelength of, for example, 13.5 nm, which can be used as a light source for semiconductor exposure.

More particularly, the EUV light source apparatus 100 according to the present embodiment is an EUV light source apparatus of a Discharge Produced Plasma (DPP) type in which a high temperature plasma raw material is supplied to surfaces of the electrodes at which the discharge is to be generated, the high temperature plasma raw material is evaporated by irradiating the high temperature plasma raw material with an energy beam such as a laser beam or the like, and then the high temperature plasma is generated by the discharge.

The EUV light source apparatus 100 includes, as shown in FIG. 1, a chamber 11 serving as a discharge vessel.

The chamber 11 is largely partitioned into two spaces by a partition wall 11a having an opening. One of the spaces is a discharge space 11b and the other of the spaces is a light condensing space 11c.

The discharge space 11b is provided with a pair of discharge electrodes 21a and 21b that are separately rotatable, respectively, and arranged to be opposed to each other and separated from each other. The discharge electrodes 21a and 21b are provided for heating and exciting the high temperature plasma raw material containing the EUV radiation species.

The pressure in the discharge space 11b is maintained in a vacuum atmosphere in order to satisfactorily generate the discharge for heating and exciting the high temperature plasma raw material.

In the light condensing space 11c, an EUV light condensing mirror (collector mirror) 12 and a debris trap 13 are arranged.

The EUV light condensing mirror 12 collects the EUV light emitted from the heated and excited high temperature plasma raw material, and guides the EUV light from an EUV light extracting unit 11d provided at the chamber 11 to, for example, an irradiation optical system (not shown) of, for example, an exposure apparatus.

The EUV light condensing mirror 12 is, for example, a light condensing mirror of an oblique incidence type and has a structure in which a plurality of thin concave mirrors are arranged to be nested with high accuracy. A reflective surface of each of concave mirrors has a shape of, for example, an ellipsoid of revolution, a paraboloid of revolution, or a Walter type, and each of concave mirrors has a shape of a body (solid) of revolution. The Walter type shape is a concave shape in which a light incidence place thereof has, in turn from the light incident side, a hyperboloid of revolution and an ellipsoid of revolution, or otherwise a hyperboloid of revolution and a paraboloid of revolution.

The EUV light condensing mirror 12 has a reflective surface shaped in either an ellipsoid of revolution or a Walter type shape or the like, and is provided with a plurality of concave mirrors of the body (solid) of revolution shape having different diameters from one another.

Those concave mirrors constituting the EUV light condensing mirror are arranged with rotation center axes thereof overlapping one another such that the focal positions thereof approximately coincide with one another on the same axis. In this way, by arranging the concave mirrors to be nested with high accuracy, the EUV light condensing mirror 12 is capable of satisfactorily reflecting the EUV light having an oblique incidence angle of 0 to 25 degrees and also condensing (or converging) the EUV light at one point.

Furthermore, a base material of respective concave mirrors is, for example nickel (Ni) or the like. The reflective surface of each of concave mirrors is constituted to be an extremely smooth surface. A reflective material to be applied to the smooth surface is a metal film of, for example, ruthenium (Ru), molybdenum (Mo), or rhodium (Rh) or the like. The reflective surface of each of concave mirrors is densely coated with such metal film.

The debris trap 13 traps a debris, which is generated as a result of the plasma generation by the discharge, and prevents the generated debris from moving into the light condensing unit (collector unit) of the EUV light.

The pair of discharge electrodes 21a and 21b arranged in the discharge space 11b are metal members of a disk (disc) shape, respectively. The discharge electrodes 21a and 21b are made from a high melting point metal of, for example, tungsten, molybdenum, or tantalum or the like. Out of the two discharge electrodes 21a and 21b, one discharge electrode 21a is a cathode, and the other discharge electrode 21b is an anode.

The discharge electrode 21a is arranged such that a part of the discharge electrode is immersed in the high temperature plasma raw material 22a contained in the container 23a. A rotating shaft 25a of a motor 24a is attached to an approximately center portion of the discharge electrode 21a. With this configuration, the discharge electrode 21a is rotated with the motor 24a rotating the rotating shaft 25a. The motor 24a is drive controlled by a controller 40.

Furthermore, the rotating shaft 25a is installed into the chamber 11 through, for example, a mechanical seal 26a. The mechanical seal 26a allows the rotating shaft 25a to rotate while maintaining the reduced pressure atmosphere in the chamber 11.

Likewise, the discharge electrode 21b is arranged such that, similarly to the discharge electrode 21a, a part of the discharge electrode is immersed in the high temperature plasma raw material 22b contained in the container 23b. A rotating shaft 25b of a motor 24b is attached to an approximately center portion of the discharge electrode 21b. With this configuration, the discharge electrode 21b is rotated with the motor 24b rotating the rotating shaft 25b. The motor 24b is drive controlled by the controller 40.

Furthermore, the rotating shaft 25b is installed into the chamber 11 through, for example, a mechanical seal 26b. The mechanical seal 26b allows the rotating shaft 25b to rotate while maintaining the reduced pressure atmosphere in the chamber 11.

The high temperature plasma raw material 22a and 22b in a liquid state, which is riding on the surfaces of the discharge electrodes 21a and 21b, is transported into the discharge region with the discharge electrodes 21a and 21b being rotated. The discharge region is here referred to as a space in which the discharge between both electrodes 21a and 21b is generated, and also as a portion having the shortest distance between edge portions of peripheries of both electrodes 21a and 21b.

As the high temperature plasma raw material 22a and 22b, the molten metal, such as tin (Sn) in a liquid state, is used. The high temperature plasma raw material 22a and 22b also acts as power supply metals for supplying electric power to the discharge electrodes 21a and 21b.

The containers 23a and 23b are connected to a pulsed power supply unit 27, respectively, through power feeding units 11f and 11g having an insulating property, which are capable of maintaining the reduced pressure atmosphere in the chamber 11, respectively. The containers 23a and 23b, and the tin 22a and 22b are all made to be electrically conductive. A part of the discharge electrode 21a and a part of the discharge electrode 21b are immersed in the tin 22a and 22b, respectively. For this reason, it makes it possible to apply the pulsed power between the discharge electrodes 21a and 21b by applying the pulsed power between the containers 23a and 23b by the pulsed power supply unit 27.

It should be noted that, although not shown in the drawings, the containers 23a and 23b are provided with temperature adjusting (or regulation) mechanisms that keep the tin 22a and 22b to be in the molten state, respectively.

The pulsed power supply unit 217 applies the pulsed power having a short pulse width between the containers 23a and 23b, in other words, between the discharge electrodes 21a and 21b. The pulsed power supply unit 27 is drive controlled by the controller 40.

A laser source 28 is an energy beam radiation unit that radiates laser light (that is, energy beam) onto the tin 22a on the discharge electrode 21a, which is transported into the discharge region. The laser source 28 is, for example, a Nd:YVO$_4$ laser device (Neodymium-doped Yttrium Orthovanadate laser device). The laser light L emitted from the laser source 28 enters into a window portion 11g of the chamber 11 through the laser light condensing unit or the like, and then guided onto the discharge electrode 21a. The controller 40 controls the radiation timing of the laser light radiated from the laser source 28.

When the laser light is radiated onto the high temperature plasma raw material transported into the discharge region in the state in which the pulsed power supply unit 27 is applying the pulsed power to the discharge electrodes 21a and 21b, then the high temperature plasma raw material is evaporated, and the pulsed discharge is initiated between both electrodes 21a and 21b. As a result, a high temperature plasma P is formed from the high temperature plasma raw material. Subsequently, when the plasma P is heated and excited by a large current, which flows at the time of discharge, and the temperature of the plasma elevates, then EUV light is emitted from the high temperature plasma P.

It should be noted that, as described above, as the pulsed power supply unit 27 applies the pulsed power between the discharge electrodes 21a and 21b, the above described discharge becomes a pulsed discharge, and the emitted EUV light becomes the pulsed light emitted in pulses.

In the above description, the discharge electrodes 21a and 21b, and the containers 23a and 23b correspond to a high temperature plasma generating unit.

The containers 23a and 23b are connected to a tin supply mechanism (that is, raw material supply mechanism) that supplies the tin 22a and 22b, respectively.

Hereinafter, a tin supply mechanism will be described in detail.

Figure 2:
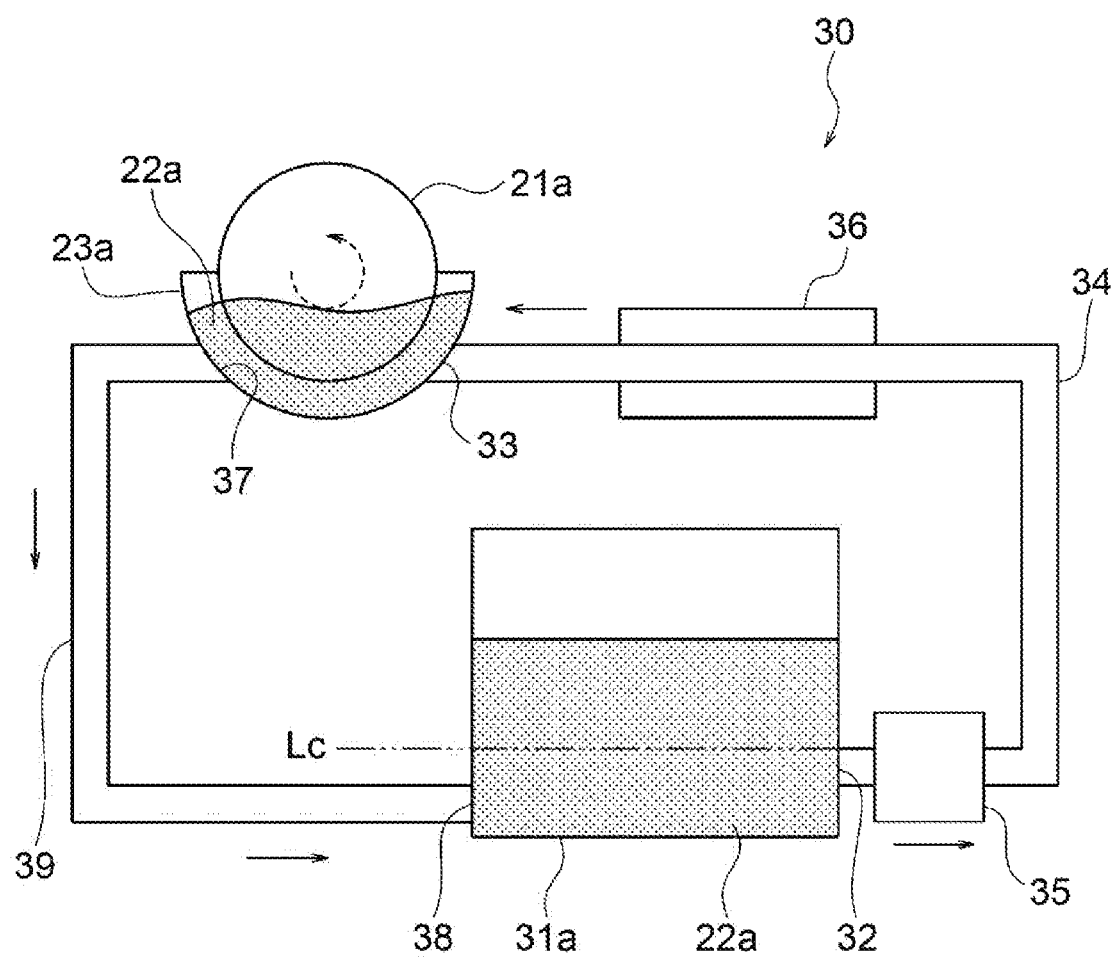
FIG. 2 is a view schematically showing an exemplary configuration of a tin supply mechanism.

FIG. 2 is a view showing an exemplary configuration of a tin supply mechanism 30 that supplies the tin 22a to the container 23a. It should be noted that another tin supply mechanism that supplies the tin 22b to the container 23b has a similar configuration to that of the tin supply mechanism 30 shown in FIG. 2. For this reason, hereinafter, only the tin supply mechanism 30 that supplies the tin 22a to the container 23a will be representatively described.

The tin supply mechanism 30 is provided with a reservoir (vessel) 31a that reserves the tin 22a. The reservoir 31a is designed to have a larger capacity than the container 23a.

In the reservoir 31a, there is provided a tin discharge port 32 at a lower part of a side wall thereof (lower than a lower limit level Lc of the tin 22a). The tin discharge port 32 is connected to a tin supply port 33 formed at the container 23a by a tin supply tube 34. The tin supply tube 34 is provided with a pump 35, and tin 22a in the reservoir 31a is driven, by the pump 35, to be supplied to the container 23a. Also, the tin supply tube 34 is provided with a cooling unit 36 for cooling the tin 22a down to the predetermined preset temperature.

Furthermore, the container 23a is provided with a tin discharge port 37 from which the tin 22a is discharged. The tin discharge port 37 is connected to a tin reflux (returning) port 38 formed at the reservoir 31a through a tin discharge tube 39.

The tin supply port 33 is formed in the vicinity of a region in the container 23a through which the discharge electrode 21a passes immediately before the discharge electrode 21a reaches at the discharge region. Also, the tin discharge port 37 is formed in the vicinity of a region in the container 23a at which a portion of the discharge electrode 21a irradiated with the laser light is again immersed in the tin 22a in the container 23a.

With the tin supply mechanism being so configured, the discharge electrode 21a is supplied with the tin 22a at a predetermined preset temperature so that the tin is transported into the discharge region before the discharge electrode is irradiated with the laser light and also before the discharge occurs. Furthermore, even when the discharge electrode 21a heated by the generated discharge contacts the tin 22a in the container 23a so as to heat the tin 22a up to the temperature exceeding a desired temperature, still the heated tin 22a is discharged from the container 23a. Thus, it does not considerably affect tin 22a to be transported at the time of next discharge.

The heated tin 22a, which returns to the reservoir 31a through the tin discharge tube 39, is then mixed with the tin 22a in the reservoir 31a so as to increase the temperature of whole tin 22a reserved in the reservoir 31a. Nevertheless, the capacity of the reservoir 31a is larger than the capacity of the container 23a, as described above. For this reason, an amount of the tin 22a reserved in the reservoir 31a is larger than an amount of the heated tin 22a refluxed (returned) to the reservoir 31a so as to allow the temperature increase of the tin 22a in the reservoir 31a to be moderated. As a result, it makes it possible to reduce the load of the cooling unit 36 when the cooling unit 36 cools the temperature of the tin 22a flowing in the tin supply tube 34 down to a desired preset temperature.

As described above, the tin 22a reserved in the reservoir 31a is cyclically supplied to the container 23a.

During the EUV radiation being generated in the EUV light source apparatus 100, as the tin as the high temperature plasma raw material is consumed, the storage amount of the tin 22a reserved in the reservoir 31a gradually decreases. In order to cope with decreasing storage amount of the tin, the reservoir 31a is provided with a mechanism that monitors the storage amount of the tin 22a and refills (replenishes) the reservoir 31a with the tin 22a such that the storage amount of the tin 22a is kept to an appropriate amount.

The reservoir 31a is provided with a liquid level sensor (not shown in the drawings) that detects the liquid level of the tin 22a reserved in the reservoir 31a. The liquid level sensor outputs a detection signal to the controller 40. The controller 40 detects, according to the detection signal output from the liquid level sensor, a current storage amount of the tin 22a in the reservoir 31a, and performs the filling control such that the storage amount of the tin is kept to the appropriate amount. When the filling is controlled, the controller 40 drive controls the tin filling mechanism (that is, high temperature plasma raw material supply apparatus) 60, which will be described below, and allows the tin filling mechanism 60 to supply the reservoir 31a with the tin 22a.

Figure 3:
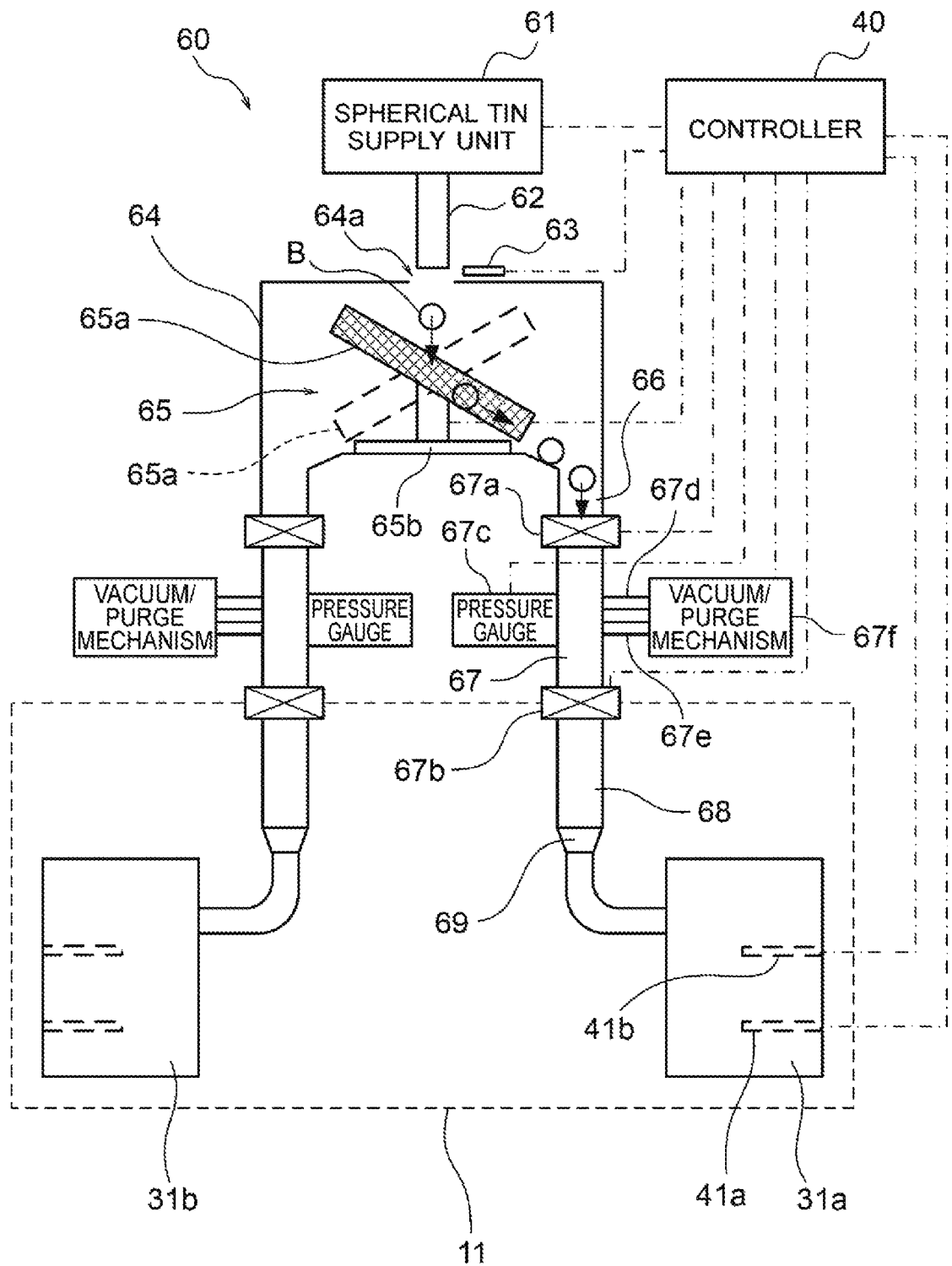
FIG. 3 is a view schematically showing an exemplary configuration of a tin filling mechanism.

FIG. 3 is a view showing an exemplary configuration of a tin filling mechanism 60.

The tin filling mechanism 60 is provided with a spherical tin supply device 61. The spherical tin supply device 61 contains the tin raw materials in a solid state. According to the present embodiment, the solid tin raw material has a spherical shape. It should be noted, however, that the solid tin raw material may have instead an arbitrary shape such as a stick (or bar) shape, an ellipsoidal shape, or other block shape or the like.

Figure 4:
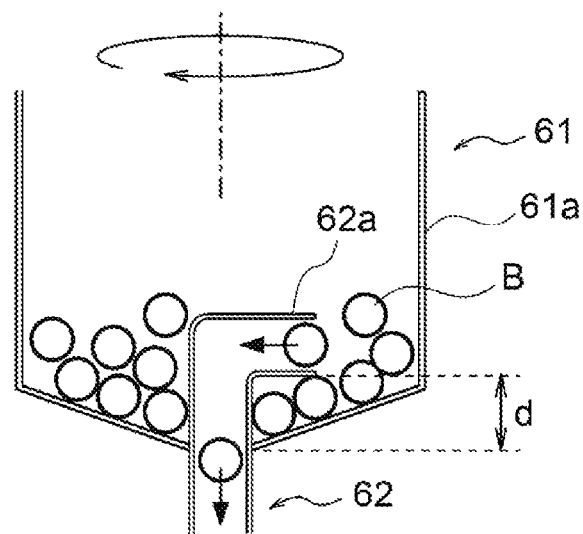
FIG. 4 is a view schematically showing an exemplary configuration of a spherical tin supply device.

The spherical tin supply device 61 is provided with, as shown in FIG. 4, a raw material reservoir unit 61a that reserves a plurality of solid tin raw materials (hereinafter also referred to as "tin balls B"). The raw material reservoir unit 61a is a vessel of, for example, a cylindrical shape having a bottom, and is constituted to be rotatably about an axis in the vertical direction (vertical direction in FIG. 4) by a rotation mechanism, which is not shown in the drawings.

The bottom of the raw material reservoir unit 61a is penetrated by a supply nozzle 62 which supplies the tin balls B reserved in the raw material reservoir unit 61a to the outside of the raw material reservoir unit 61a. As shown in FIG. 4, the supply nozzle 62 is shaped in an L-shape in which a tip opening 62a of the supply nozzle 62 inside the raw material reservoir unit 61a is directed in the horizontal direction, and the tip opening 62a is positioned above the bottom of the raw material reservoir unit 61a by the distance d. The distance d here may be, for example, equal to or great then a diameter of the tin ball B.

The raw material reservoir unit 61a is configured to be rotatable relative to the supply nozzle 62. The controller 40 performs the rotation control to the raw material reservoir unit 61a. When the raw material reservoir unit 61a rotates by the rotation control by the controller 40, then the tin balls B reserved in the raw material reservoir unit 61a move and get into the tip opening 62a of the supply nozzle 62, straightforwardly pass through the supply nozzle 62, and are eventually discharged to the outside of the raw material reservoir unit 61a from the lower end of the supply nozzle 62.

It should be noted that the supply nozzle 62 may be shaped in a substantially L-shape in which the tip opening 62a of the supply nozzle 62 is directed in the substantially horizontal direction. In other words, the supply nozzle 62 may have any shape that allows the tin balls B to intermittently enter therein one by one by rotating the raw material reservoir unit 61a and avoids the tin balls B to enter therein from an upper side of the supply nozzle 62.

Referring now back to FIG. 3, down below the lower end of the supply nozzle 62 there is provided a sensor (that is, raw material counter unit) 63 that counts a number of tin balls B supplied from the supply nozzle 62. As the sensor 63, for example, a laser sensor may be used.

Furthermore, immediately below the supply nozzle 62 and down below the sensor 63 there is provided a housing 64 arranged therebelow. The housing 64 includes a raw material supply port 64a having an opening through which the tin balls B can pass. The raw material supply port 64a is formed immediately below the lower end of the supply nozzle 62. With the supply port 64a being so configured, the tin balls B discharged from the lower end of the supply nozzle 62 straightforwardly fall down, and pass through the raw material supply port 64a, and are supplied to the housing 64.

The controller 40 is capable of counting the number of tin balls B supplied to the housing 64 from the spherical tin supply device 61 by monitoring the detection signal from the sensor 63. In addition, the controller 40 is capable of detecting a defect that, for example, the spherical tin supply device 61 fails to supply the tin balls B (due to, for example, the clogging of the supple nozzle 62 or the like).

Furthermore, the controller 40 is capable of controlling the supply number (that is, supplied amount) of the tin balls B to the housing 64 from the spherical tin supply device 61 by controlling the rotation of the raw material reservoir unit 61a according to the detection signal from the sensor 63.

In addition, the controller 40 is capable of supplying the tin balls B intermittently one by one from the spherical tin supply device 61 by controlling the rotation of the raw material reservoir unit 61a. Furthermore, the controller 40 is capable of controlling the supply interval of the tin balls B by controlling the rotation of the raw material reservoir unit 61a.

Down below the raw material supply port 64a in the housing 64 there is provided a supply selection mechanism 65. The supply selection mechanism 65 is a mechanism that selects a supply destination of the tin balls B. More particularly, the supply selection mechanism 65 is configured to be capable of selecting whether the tin balls B are supplied to the reservoir 31a at the cathode side corresponding to the discharge electrode 21a or to the reservoir 31b at the anode side corresponding to the discharge electrode 21b.

The supply selection mechanism 65 is provided with a supply path 65a that is configured to be capable of changing a guiding direction of the tin balls B. More particularly, the supply path 65a has a seesaw structure that is capable of oscillating (rocking or swinging) about a predetermined axis in the horizontal direction. By controlling, by the controller 40, the inclination (or slope) of the supply path 65a, it makes it possible to switch the rolling destination of the tin balls B.

More particularly, when the supply path 65a is in the state shown by the solid line in FIG. 3, the tin balls B are supplied to the reservoir 31a at the cathode side. On the other hand, when the supply path 65a is in the state shown by the dotted line in FIG. 3, the tin balls B are supplied to the reservoir 31b at the anode side.

Figure 5:
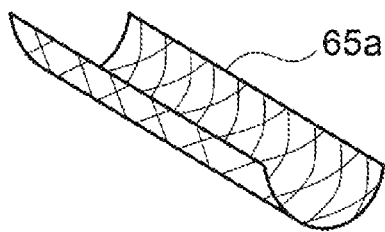
FIG. 5 is a view schematically showing an exemplary configuration of a supply path.

Furthermore, the supply path 65a has a plurality of holes each of which is smaller than the tin ball B. For example, the supply path 65a may be configured to be a mesh-like (net-like or meshed) path having a U-shaped cross section, as shown in FIG. 5. The supply path 65a is made of, for example, metal, and made of a material that is harder than the tin ball B. In addition, the entire weight of the supply path 65a and the seesaw structure supporting the supply path 65a in a drivable manner is greater than the tin balls B.

It should be noted that the supply path 65a may have any arbitrary shape as long as the supply path 65a has a shape that allows the tin balls B to roll and move. Furthermore, the supply path 65a may be constituted with any arbitrary material such as acryl or metal or the like.

Nevertheless, it is preferable that the supply path 65a is constituted with a material that is capable of suppressing the tin balls B from largely bouncing up (back) when receiving the tin balls B falling (dropping) down from the raw material supply port 64a. It is also preferable that the supply path 65a is constituted with metal that is harder than the tin ball B, as described above, because it can effectively suppress the tin balls B from bouncing back by, for example, slightly deforming the tin balls B or allowing the tin balls B to inelastically collide against the supply path 65a or the like.

The tin balls B, which fall (drop) down from the raw material supply port 64a and are then received by the supply path 65a, roll on the supply path 65a so as to be supplied to raw material supply tubes 66. The raw material supply tubes 66 are provided corresponding to the reservoir 31a and the reservoir 31b, respectively. The tin balls B are supplied to one of the raw material supply tubes 66 corresponding to a supply destination selected by the supply selection mechanism 65. Hereinafter, the case in which the tin balls B are supplied to the reservoir 31a will be representatively described.

Each of the raw material supply tubes 66 is provided with a load lock unit (load lock chamber) 67 having a load lock mechanism. The load lock unit 67 is partitioned by a first gate valve 67a and a second gate valve 67b. The first gate valve 67a is provided at the housing 64, and the second gate valve 67b is provided at the chamber 11 of the EUV light source apparatus 100, which serves as the vacuum vessel. As described above, the load lock unit 67 is arranged between the housing 64, which is a space to which the tin balls B are supplied from the supply nozzle 62, and the chamber 11, which is a space in which the reservoir 31a is arranged.

The load lock space, which is partitioned by the first gate valve 67a and the second gate valve 67b, is provided with a pressure gauge (manometer) 67c, a vacuuming pipe (conduit) 67d, and a purge gas supplying pipe 67e. The vacuuming pipe 67d and the purge gas supplying pipe 67e are connected to the vacuuming and purging mechanism (vacuum/purge mechanism) 67f that performs the vacuuming and the purge gas supply, respectively.

The tin balls B, which have passed through the supply path 65a, roll on an inclined portion of the raw material supply tube 66, and are then once supplied to the load lock unit 67. More particularly, the tin balls B are supplied to the load lock unit 67 in which the first gate valve 67a is in an opened state and the second gate valve 67b is in a closed state.

It should be noted that the spherical tin supply device 61 stops transporting of tin balls B when a predetermined amount of tin balls B have been supplied to the load lock unit 67. It is assumed that the above described predetermined amount is set to an amount (number) in which the clogging of the tin balls B does not occur in the path from the load lock unit 67 to the reservoir 31a.

When the predetermined amount of the tin balls B are supplied to the load lock unit 67, the controller 40 closes the first gate valve 67a at an upper portion of the load lock unit 67. The controller 40 then controls the vacuuming and purging mechanism 67f to start to vacuum the load lock unit 67 through the vacuuming pipe 67d. At this moment, the pressure gauge 67c measures the pressure inside the load lock unit 67.

Subsequently, the controller 40 opens, according to the measurement result from the pressure gauge 67c, the second gate valve 67d at the lower portion of the load lock unit 67 if it is determined that the sufficient vacuuming is obtained inside the load lock unit 67 (in other words, the pressure inside the chamber 11 substantially coincides with the pressure inside the load lock unit 67).

The chamber 11 is provided with an insulation channel 68 for supplying solid tin, which is a connection path connecting the load lock unit 67 (the second gate valve 67d) to the reservoir 31a, inside the chamber 11. In addition, a tapered portion 69 is formed at an end portion of the insulation channel 68 for supplying solid tin at the reservoir 31a side.

With this configuration, when the controller 40 opens the second gate valve 67d, then the tin balls B supplied to the load lock unit 67 are injected into the reservoir 31*a* through the insulation channel 68 for supplying solid tin and the tapered portion 69. It should be noted that the insulation channel 68 for supplying solid tin and, as appropriate, the tapered portion 69 are constituted with an insulating material, as the chamber 11 of the EUV light source apparatus 100 encloses the high voltage portion such as the discharge electrodes or the like therein.

Although the tin filling mechanism 60 as shown in FIG. 3 has the insulation channel 68 for supplying solid tin as a linear connection path, alternatively, at least a part of the insulation channel 68 for supplying solid tin may have a curvature portion. In this case, it makes it possible to allow the tin balls B in the insulation channel 68 for supplying solid tin to have the distribution of velocity. For this reason, it makes it possible to prevent the tin balls B supplied from the load lock unit 67 from reaching to the tapered portion 69 all at once so as to prevent the tapered portion 69 from being clogged with the tin balls B.

After the tin balls Bare injected into the reservoir 31*a*, the controller 40 closes the second gate valve 67*b* at the lower portion of the load lock unit 67, and causes the purge gas supplying pipe 66*e* to purge inside the load lock unit 67 with purge gas (for example, argon (Ar) gas). Subsequently, when purging the load lock unit 67 is completed, the controller 40 opens the first gate valve 67*a* at the upper portion of the load lock unit 67. As a result, next refilling of the tin balls B becomes ready to start.

The above described refilling processes are initiated when the liquid level of the tin 22*a* in the reservoir 31*a* reaches below a refilling level that is above the above described lower limit level Lc. It can be detected by a lower level sensor 41*a* provided at the reservoir 31*a* whether the liquid level of the tin 22*a* in the reservoir 31*a* reaches the refilling level or not. The controller 40 starts to supply the tin balls B to the reservoir 31*a* in response to the detection signal from the lower level sensor 41*a*.

When the tin balls B are supplied to the reservoir 31*a*, the tin balls B dissolve in the reservoir 31*a* so that the liquid level of the liquid tin in the reservoir 31*a* elevates. The controller 40 repeats the above described refilling processes until the liquid level in the reservoir 31*a* reaches an upper limit level, which is above the above described refilling level.

It can be detected by an upper level sensor 41*b* provided at the reservoir 31*a* whether the liquid level of the tin 22*a* in the reservoir 31*a* reaches the upper limit level or not. Then the controller 40 stops supplying the tin balls B to the reservoir 31*a* if it is determined that the liquid level in the reservoir 31*a* reaches the upper level in response to the detection signal from the upper level sensor 41*b*.

By performing the above described refilling processes, it makes it possible to prevent the liquid level of the tin 22*a* in the reservoir 31*a* from falling below the lower limit level Lc in an assured manner. In addition, it makes it possible to prevent the liquid level of the tin 22*a* in the reservoir 31*a* from overflowing exceeding the upper limit level in an assured manner. In this way, as the reservoir 31*a* is capable of constantly reserving an appropriate amount of tin 22*a* therein, the EUV light source apparatus 100 is capable of emitting the EUV light in a stable manner.

As described above, the tin filling mechanism 60 according to the present embodiment supplies the reservoir 31*a* with the tin balls B, which are in a solid state. As a result, it is unnecessary to provide a heating mechanism for preventing the tin from solidifying or to applying the chemical resistance to the tin filling mechanism 60, unlike the conventional case in which the reservoir 31*a* is supplied with the liquid tin.

Furthermore, the tin filling mechanism 60 includes a raw material reservoir unit 61*a*, which reserves a plurality of tin balls B and are arranged rotatably, and a supply nozzle 62, which penetrates into the raw material reservoir unit 61*a* and supplies the tin balls B reserved in the raw material reservoir unit 61*a* to the outside of the raw material reservoir unit 61*a*. With the tin filling mechanism 60 being so configured, the supply nozzle 62 is capable of supplying the tin balls B by rotating the raw material reservoir unit 61*a* by the controller 40. As a result, it makes it possible to attain the supply of solid tin with a simplified structure.

Furthermore, the controller 40 is capable of controlling the supply number of the tin balls B supplied from the supply nozzle 62 and/or the supply interval thereof. For this reason, it makes it possible to prevent a large amount of tin balls B from being supplied all at once from the supply nozzle 62 so that it is possible to intermittently supply the tin balls B instead. As a result, it makes it possible to prevent the tin balls B from clogging.

As the high voltage is being applied to inside the EUV light source during the EUV light being emitted, once the clogging occurs unintentionally, it is required to stop operating the EUV light source apparatus and dissolve the clogging. According to the present embodiment, as the clogging is prevented from occurring, it makes it possible to suppress the operation of the EUV light source apparatus from being stopped.

Yet furthermore, as it can prevent a large amount of tin balls B from being supplied to the reservoir 31*a* all at once, it makes it possible to prevent the temperature of the liquid tin 22*a* reserved in the reservoir 31*a* from being rapidly lowered.

When the temperature of the liquid tin 22*a* reserved in the reservoir 31*a* is rapidly lowered, it may change the emission condition of the EUV light. In this case, it is likely to fail to obtain a desired EUV light output. In addition, when the temperature of the liquid tin 22*a* in the reservoir 31*a* is considerably lowered, it takes long time to adjust the temperature inside the reservoir 31*a* by the temperature adjusting mechanism. For this reason, it may be required to stop operating the EUV light source apparatus until the temperature inside the reservoir 31*a* reaches up to an appropriate temperature. According to the present embodiment, by preventing the temperature inside the reservoir 31*a* from being rapidly lowered, it makes it possible to avoid to fail to obtain the desired EUV light output and also to prevent the operation of the EUV light source apparatus from being stopped.

Yet furthermore, the supply nozzle 62 is shaped in an L-shape in which the tip opening 61*a* of the supply nozzle 62 is directed in the horizontal direction in the raw material reservoir unit 61*a*. Thus, the supply nozzle 62 has a structure that avoids the tin balls B reserved in the raw material reservoir unit 61*a* to easily get into the supply nozzle 62. For this reason, it makes it possible to prevent the supply nozzle 62 from unintentionally supplying a large amount of tin balls B. As a result, it makes it possible to prevent the above described clogging of tin from occurring and to prevent the temperature in the reservoir 31*a* from being rapidly lowered.

Yet furthermore, as the tin filling mechanism 60 is provided with the sensor 63 that counts the number of tin balls B supplied from the spherical tin supply device 61, it makes it possible to control the supply amount of the tin balls B to the reservoir 31*a* in an appropriate manner. In addition, it makes it possible to immediately detect as appropriate the defect that, for example, the spherical tin supply device 61 fails to supply the tin balls B.

Yet furthermore, the tin filling mechanism 60 is provided with the supply path 65*a* in the mesh-like (meshed) shape that guides the tin balls B supplied from the supply nozzle 62 to the load lock unit 67. When a surface of the tin ball B is coated (or covered) by the tin oxide, in some cases, the tin oxide, which exfoliates due to the contact between the tin balls B in the raw material reservoir unit 61*a*, is undesirably discharged from the supply nozzle 62. Also, when the tin balls B roll and move on the supply path 65*a*, in some cases, the tin oxide on the surface of the tin ball B exfoliates. According to the present embodiment, as the supply path 65*a* is provided with the holes smaller than the tin ball B, it makes it possible to allow the tin oxide to fall down from the holes so as to prevent the impurities from entering into the reservoir 31*a*.

It should be noted that, as shown in FIG. 3, by arranging a tin oxide reservoir 65*b* at the lower portion of the supply path 65*a*, it makes it possible to recover the tin oxide, which has exfoliated from the tin balls B and fallen from the supply path 65*a*, in an appropriate manner.

Yet furthermore, by constituting the supply path 65*a* with the metal harder than the tin ball B, it makes it possible to suppress the tin balls B from bounding back when receiving the tin balls B falling down from the supply nozzle 62 of the spherical tin supply device 61. As a result, it makes it possible to guide the tin balls B to the raw material supply tube 66 in an appropriate manner.

Yet furthermore, the supply path 65*a* may be configured to be able to change (or switch) the guiding direction of the tin balls B.

With the supply path 65*a* being so configured, it makes it possible to supply the tin balls B by switching the supply destination between the reservoir 31*a* at the cathode side and the reservoir 31*b* at the anode side. In other words, it makes it possible to share the tin filling mechanism between the reservoir 31*a* and the reservoir 31*b*. Yet furthermore, by configuring the supply path 65*a* in a seesaw structure, it makes it possible to achieve the switching of the supply destination of the tin balls B with a simplified structure.

As described above, according to the high plasma raw material supply apparatus (tin filling mechanism 60) of the present embodiment, it makes it possible to supply the high temperature plasma raw material to the vessel (reservoirs 31*a* and 31*b*), which reserves the high plasma raw material in a liquid state such as molten tin or the like, with a relatively simplified structure.

In addition, it makes it possible to prevent the impurities such as oxide or the like of the high plasma raw material from being mixed into the above described vessels. As a result, the EUV light source apparatus 100 provided with this kind of high temperature plasma raw material supply apparatus is capable of emitting the EUV light in a stable manner.

Modification to Embodiments

In the above described embodiments, a certain case in which the supply path 65*a* is configured to be a mesh-like path as shown in FIG. 5 has been described. However, the supply path 65*a* may have any other shape as long as the tin balls B can roll and move thereon and the supply path 65*a* has a hole from which the tin oxide exfoliated from the surfaces of the tin balls B falls down.

Figure 6:
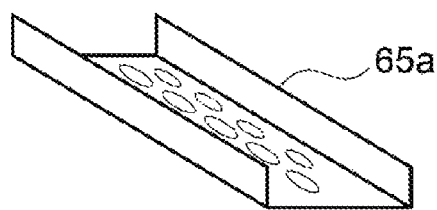
FIG. 6 is a view schematically showing another exemplary configuration of a supply path.

For example, the supply path 65*a* may have, as shown in FIG. 6, a shape that includes a bottom on which a plurality of holes are formed and side walls joined to opposing sides of the bottom, respectively.

Also, in the above described embodiments, a certain case in which the supply path 65*a* is configured to have the seesaw structure that is capable of oscillating (rocking) about a predetermined axis in the horizontal direction has been described. However, the supply path 65*a* may have any other shape that is capable of switching the supply destination (guiding direction) of the tin balls B.

Figure 7:
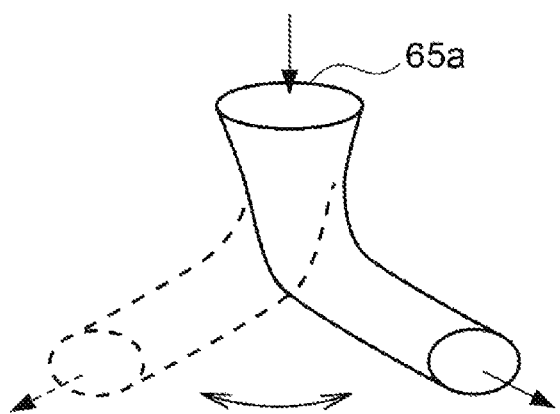
FIG. 7 is a view schematically showing yet another exemplary configuration of a supply path.

For example, the supply path 65*a* may have a structure that is capable of oscillating (rocking) about a predetermined axis in the vertical direction. Yet furthermore, the shape of the supply path 65*a* is not limited to the shape opened upwardly, but the supply path 65*a* may have a tube like shape. For example, the supply path 65*a* may be configured to be a mesh-like path having a tube-like shape that is plastically deformable so as to change (switch) the guiding direction of the tin balls B by deforming the end portion of the supply path 65*a*, as shown in FIG. 7.

Figure 8:
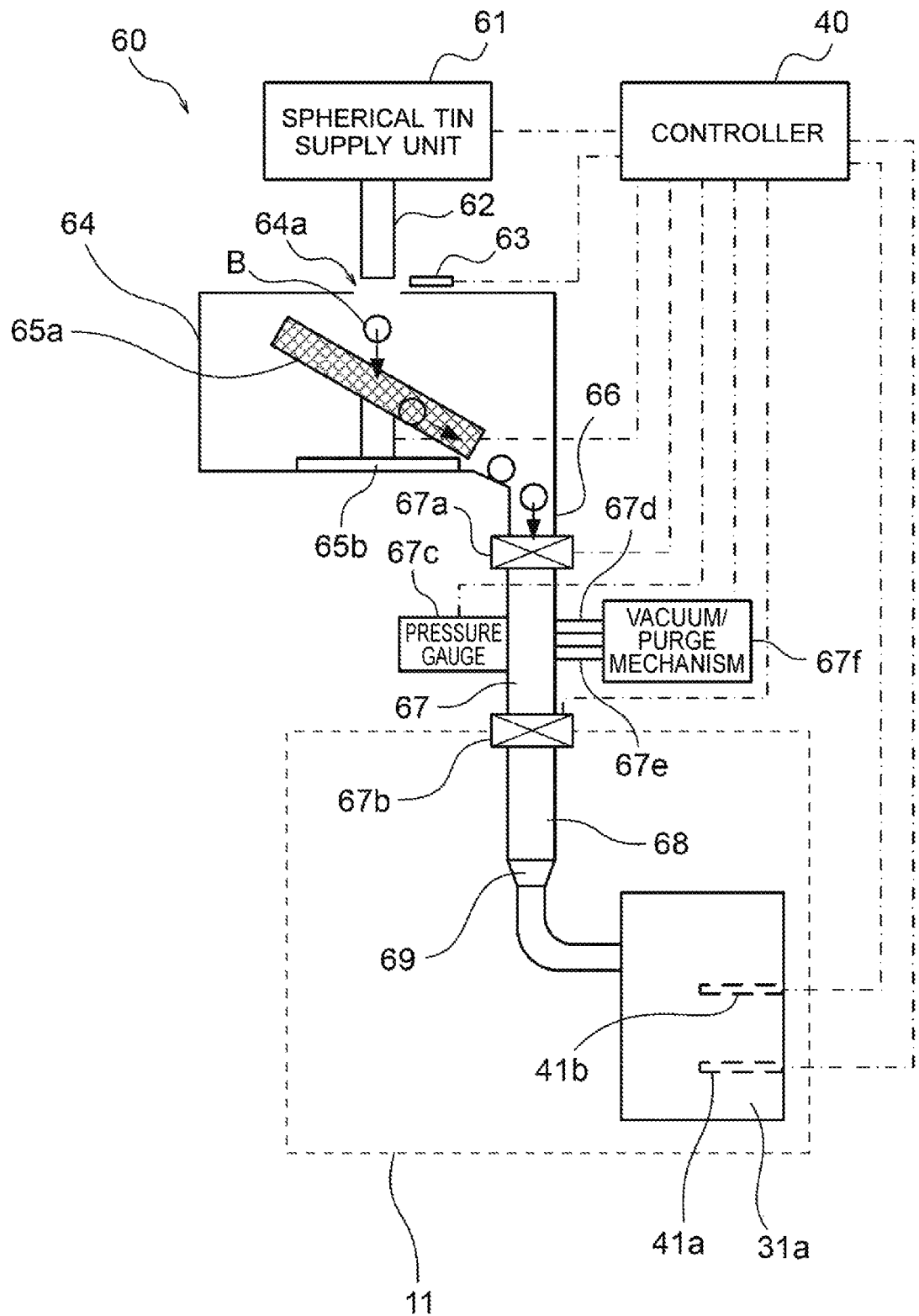
FIG. 8 is a view schematically showing another exemplary configuration of a tin filling mechanism.

Yet furthermore, in the above described embodiments, a certain case in which the supply destination of the tin balls B is switched by the supply path 65*a* has been described. However, a tin filling mechanism for the reservoir 31*a* at the cathode side may be separately provided from another tin filling mechanism for the reservoir 31*b* at the anode side. In this case, the tin filling mechanism for the reservoir 31*a* at the cathode side may be configured as shown in FIG. 8.

Application Examples

Although in the above described embodiments, a certain case in which the laser is used as an energy beam to be radiated onto the high temperature plasma raw material has been described, an ion beam or an electron beam or the like may be used instead of the laser.

Also, although in the above described embodiments, a certain case in which the present invention is applied to the EUV light source apparatus of the DPP type has been described, the present invention may be applied to an EUV light source apparatus of the LPP type. The EUV light source apparatus of the LPP type supplies the vacuum chamber with the high temperature plasma raw material (target raw material) in a droplet through the raw material supply nozzle from the reservoir reserving the high temperature plasma raw material in a liquid state. Then the EUV light source apparatus of the LPP type irradiates the target raw material with a driver laser for generating plasma, excites the target raw material to generate the high temperature plasma, and radiates the EUV light. The above described embodiments may be also applied to the case in which the reservoir used in the EUV light source apparatus of the LPP type is supplied with the high temperature plasma raw material.

Yet furthermore, in the above described embodiments, a certain case in which the EUV light source apparatus is used as a light source for the semiconductor exposure has been described. However, the present invention is not limited to those applications and may be used as a light source for an inspection apparatus or the like for an exposure mask.

While certain embodiments have been described, these embodiments have been presented by way of example only, and are not intended to limit the scope of the present invention. The novel apparatuses and methods thereof described herein may be embodied in a variety of other forms. Furthermore, various omissions, substitutions and modifications in the form of the apparatuses and methods thereof described herein may be made without departing from the gist of the present invention. The accompanying claims and their equivalents are intended to cover such forms or modifications as would fall within the scope and gist of the present invention.

REFERENCE SIGNS LIST

1 Chamber
13 Foil Trap
21a, 21b Discharge Electrodes
22a, 22b High Temperature Plasma Raw Materials
23a, 23b Containers
28 Laser Source
30 Tin Supply Mechanism
31a, 31b Reservoirs
40 Controller
60 Tin Filling Mechanism
61 Spherical Tin Supply Device
62 Supply Nozzle
65a Supply Path
67 Load Lock Unit
100 Extreme Ultra Violet Light Source Apparatus (EUV Light Source Apparatus)

What is claimed is:

1. A high temperature plasma raw material supply apparatus for supplying a high temperature plasma raw material to a container containing the high temperature plasma raw material in a liquid state for generating a high temperature plasma, comprising:
    a raw material reservoir unit configured to reserve a plurality of high temperature plasma raw materials in a solid state, the plurality of high temperature plasma raw materials each having a spherical shape;
    a supply nozzle penetrating into the raw material reservoir unit and configured to supply the high temperature plasma raw materials reserved in the raw material reservoir unit to an outside of the raw material reservoir unit;
    a load lock unit provided between a space to which the high temperature plasma raw materials are supplied from the supply nozzle and a space in which the container is arranged; and
    a supply path unit configured to guide the high temperature plasma raw materials supplied from the supply nozzle to the load lock unit,
    the supply path unit being configured to allow the high temperature plasma raw materials falling down from the supply nozzle to roll on the supply path unit to pass therethrough, the supply path unit being provided with a plurality of holes, at least on a face of the supply path unit on which the high temperature plasma raw materials roll on, each of the plurality of holes formed to be smaller than each of the high temperature plasma raw materials, wherein
    the raw material reservoir unit is rotatable about an axis in a vertical direction with respect to the supply nozzle, and
    the supply nozzle has a tip opening directed in a horizontal direction in the raw material reservoir unit positioned above a bottom of the raw material reservoir unit.

2. The high temperature plasma raw material supply apparatus according to claim 1, further comprising:
    a controller configured to control at least one of a supply number and a supply interval of the high temperature plasma raw materials supplied from the supply nozzle.

3. The high temperature plasma raw material supply apparatus according to claim 1, wherein
    the supply nozzle is shaped in an L-shape in which the tip opening of the supply nozzle outside the raw material reservoir unit is directed downwardly in a vertical direction.

4. The high temperature plasma raw material supply apparatus according to claim 1, further comprising:
    a raw material counter unit configured to count the high temperature plasma raw materials supplied from the supply nozzle.

5. The high temperature plasma raw material supply apparatus according to claim 1, wherein
    the supply path unit has a bottom composed of a mesh.

6. The high temperature plasma raw material supply apparatus according to claim 1, wherein
    the supply path unit is configured to be capable of changing a guiding direction of the high temperature plasma raw materials.

7. The high temperature plasma raw material supply apparatus according to claim 1, wherein
    the supply path unit is configured to be capable of oscillating about an axis in a horizontal direction.

8. The high temperature plasma raw material supply apparatus according to claim 1, wherein
    the supply path unit is made of a material harder than the high temperature plasma raw material in the solid state.

9. An extreme ultra violet light source apparatus for radiating extreme ultra violet light, comprising:
    the high temperature plasma raw material supply apparatus according to claim 1;
    the container;
    a chamber constituting a space in which the container is arranged;
    a raw material supply mechanism configured to supply the high temperature plasma raw material in a liquid state contained in the container to a high temperature plasma generating unit configured to generate the high temperature plasma; and
    the high temperature plasma generating unit configured to heat and excite the high temperature plasma raw material in the liquid state supplied from the raw material supply mechanism and generate the high temperature plasma.

10. The extreme ultra violet light source apparatus according to claim 9, further comprising:
    a connection path unit arranged in the chamber and configured to connect the load lock unit to the container, and
    at least a part of the connection path unit including a curvature portion.

* * * * *